US008736333B1

(12) United States Patent
Terçariol et al.

(10) Patent No.: US 8,736,333 B1
(45) Date of Patent: May 27, 2014

(54) SCHMITT TRIGGER CIRCUIT WITH NEAR RAIL-TO-RAIL HYSTERESIS

(71) Applicants: Walter L. Terçariol, Campinas (BR); Richard Titov Lara Saez, Campinas (BR)

(72) Inventors: Walter L. Terçariol, Campinas (BR); Richard Titov Lara Saez, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/736,440

(22) Filed: Jan. 8, 2013

(51) Int. Cl.
*H03K 3/00* (2006.01)
(52) U.S. Cl.
USPC ............................................ 327/205; 327/206
(58) Field of Classification Search
USPC .................................. 327/108, 205, 206, 427
See application file for complete search history.

(56) References Cited

U.S. PATENT DOCUMENTS

| 4,859,873 | A |   | 8/1989  | O'Shaughnessy |         |
|-----------|---|---|---------|---------------|---------|
| 5,945,859 | A |   | 8/1999  | Pang          |         |
| 6,008,679 | A | * | 12/1999 | Masuda        | 327/206 |
| 6,870,413 | B1|   | 3/2005  | Chang         |         |
| 2002/0075052 | A1 | * | 6/2002 | Tailliet     | 327/206 |

OTHER PUBLICATIONS

Z. Wang et al., CMOS Current Schmitt Trigger with Fully Adjustable Hysteresis, Electronic Letters, vol. 25, No. 6, Mar. 16, 1989, pp. 397-398.
Z. Wang et al., Novel CMOS Current Schmitt Trigger, Electronic Letters, vol. 24, No. 24, Nov. 24, 1988, pp. 1514-1516.
Z. Wang, CMOS Adjustable Schmitt Triggers, IEEE Transactions on Instrumentation and Measurement, vol. 40, No. 3, Jun. 1991, pp. 601-605.
A. Pfister, Novel CMOS Schmitt Trigger with Controllable Hysteresis, Electronic Letters, vol. 28, No. 7, Mar. 26, 1992, pp. 639-641.
M. Steyaert et al., Novel CMOS Schmitt Trigger, Electronic Letters, vol. 22, No. 4, Feb. 13, 1986, pp. 203-205.
V. Katyal et al., Adjustable Hysteresis CMOS Schmitt Triggers, IEEE International Symposium on Circuits and Systems, May 2008, pp. 1938-1942.

* cited by examiner

*Primary Examiner* — Long Nguyen
(74) *Attorney, Agent, or Firm* — Luiz von Paumgartten; Fogarty, L.L.C.

(57) ABSTRACT

Schmitt trigger with rail-to-rail or near rail-to-rail hysteresis. In some embodiments, a method includes switching an output of a Schmitt trigger from a first logic state to a second state in response to an input meeting a threshold, where the threshold is applied to a first transistor of a first doping type and the input is applied to a second transistor of the first doping type, the first and second transistors operably coupled to each other through a current mirror of a second doping type. The first doping type may be an n-type, the second doping type may be a p-type, and the threshold may be a rising threshold having a value within 10% of a supply voltage. Alternatively, the first doping type may be a p-type, the second doping type may be an n-type, and the threshold may be a falling threshold having a value within 10% of ground.

20 Claims, 3 Drawing Sheets

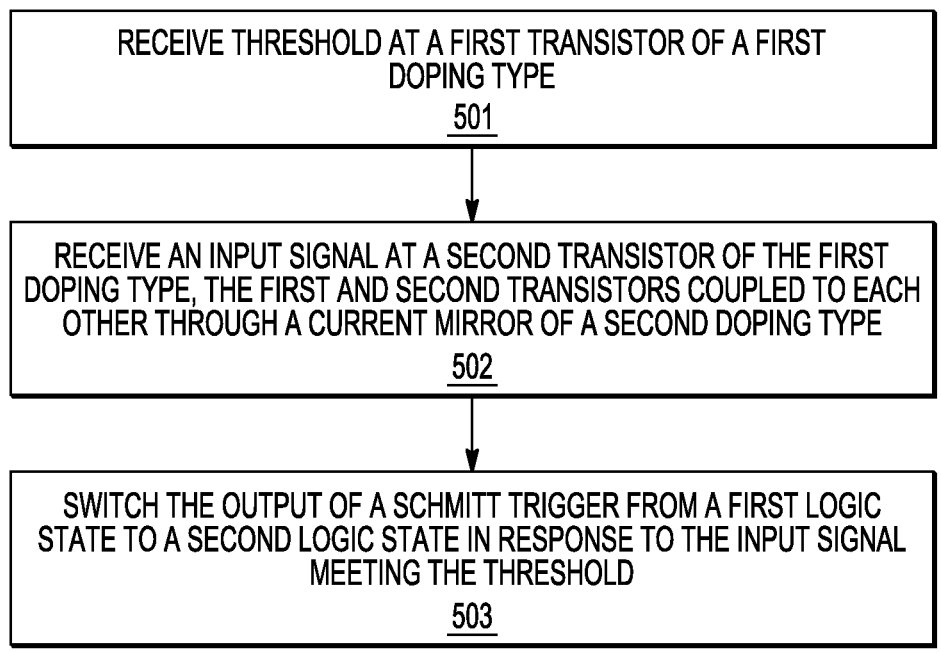
FIG. 5    500

SCHMITT TRIGGER CIRCUIT WITH NEAR RAIL-TO-RAIL HYSTERESIS

FIELD

This disclosure relates generally to electronic devices, and, more specifically, to a Schmitt trigger circuit with near rail-to-rail hysteresis.

BACKGROUND

A "Schmitt trigger" is an electronic circuit whose output stays constant until its input reaches one of two distinct threshold levels. Particularly, when the circuit's input signal overcomes a "high threshold level," the output is switched from a first logic state to a second logic state. The output remains in this second logic state so long as the input voltage stays above a "low threshold level." Then, when the input signal drops below the low threshold level, the output of the circuit returns to the first logic state.

In a non-inverting configuration, when an input voltage is higher than the high threshold level, the output of the circuit is at a logic high (e.g., "1" or "$V_{dd}$"). When the input voltage is below the low threshold level, the output of the circuit is at a logic low (e.g., "0" or ground). Moreover, when the input voltage is between the high and low threshold levels, the output of the circuit retains whichever of the two logic values it may already be in. In an inverting configuration, the complementary scenario is true—that is, when the input is higher than the high threshold level, the output is at a logic low, and, when the input is below the low threshold level, the output is at a logic high. The Schmitt trigger's "dual threshold action" is often referred to as "hysteresis."

A conventional Schmitt trigger circuit suffers from process-voltage-temperature (PVT) variations when it operates near the rails—that is, close to the supply voltage (e.g., $V_{dd}$) or to the ground voltage (e.g., 0 V). Particularly, when a conventional Schmitt trigger's high and low threshold levels are set at values close to the rails (and therefore far from $V_{dd}/2$), the circuit tends to operate improperly. The inventors have determined that this problem is due, at least in part, to the fact that a conventional Schmitt trigger operates based upon voltage and/or current comparisons that are performed by a combination of P-type Metal-Oxide Semiconductor (PMOS) and an N-type MOS (NMOS) devices, each of which has different physical characteristics. Nonetheless, it would be desirable to provide a Schmitt trigger circuit having trigger thresholds with voltage values near the rails that is insensitive to PVT variations.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

FIG. 5 is a flowchart of an example of a method of operating a Schmitt trigger circuit with quasi rail-to-rail hysteresis according to some embodiments.

DETAILED DESCRIPTION

A Schmitt trigger circuit is provided that has high and low thresholds values near the supply rails while being less PVT sensitive than traditional Schmitt triggers. The Schmitt trigger circuit, such as described below, may employ devices of the same doping type when comparing a threshold voltage to an input voltage. As the circuit's input voltage rises ("rising trip"), the circuit receives a high threshold voltage at an NMOS device and the input voltage is applied to another NMOS device. The NMOS devices are coupled to each other through a PMOS-based current mirror. Conversely, as the circuit's input voltage falls ("falling trip"), a low threshold voltage is applied to a PMOS device and the input voltage is applied to another PMOS device. The PMOS devices are coupled to each other through an NMOS-based current mirror.

Accordingly, embodiments disclosed herein are directed to Schmitt trigger circuits with reduced sensitivity to PVT variations and therefore capable of operating with quasi rail-to-rail hysteresis—that is, with high and low threshold levels that are equal to or near the supply and ground voltages.

In many implementations, such circuits may be incorporated into a wide range of electronic devices including, for example, computer systems or Information Technology (IT) products (e.g., servers, desktops, laptops, switches, routers, etc.), telecommunications hardware, consumer devices or appliances (e.g., mobile phones, tablets, televisions, cameras, sound systems, etc.), scientific instrumentation, industrial robotics, medical or laboratory electronics (e.g., imaging, diagnostic, or therapeutic equipment, etc.), transportation vehicles (e.g., automobiles, buses, trains, watercraft, aircraft, etc.), military equipment, etc. More generally, the circuits discussed herein may be incorporated into any device or system having one or more electronic parts or components.

Figure 1:
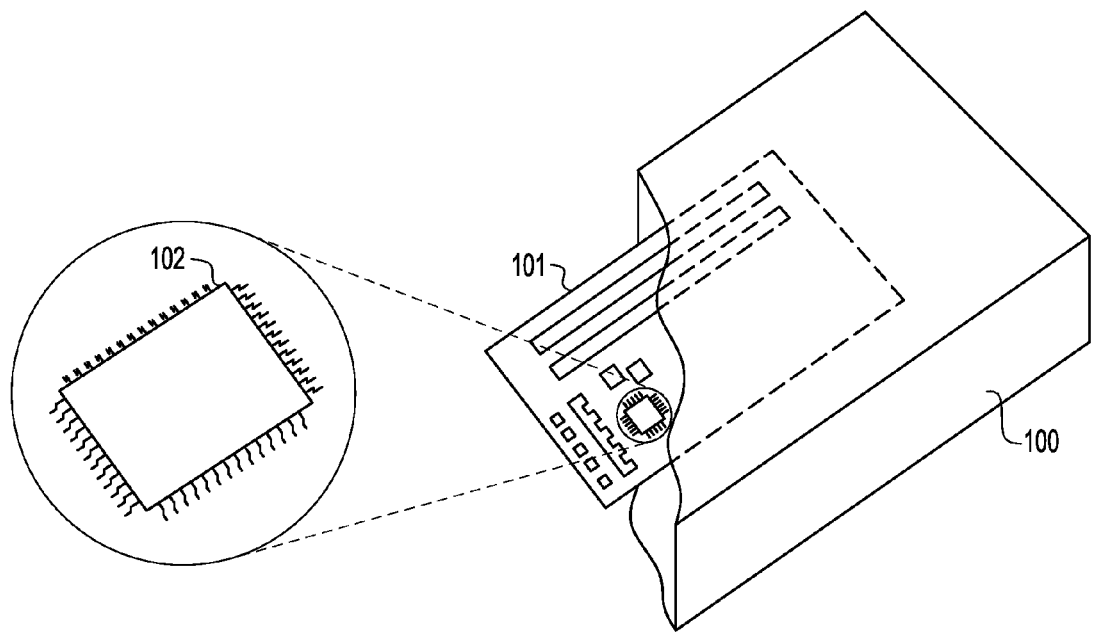
FIG. 1 is a diagram of an example of an electronic device comprising one or more integrated circuits according to some embodiments.

Turning to FIG. 1, a block diagram of electronic device 100 is depicted. In some embodiments, electronic device 100 may be any of the aforementioned electronic devices, or any other electronic device. As illustrated, electronic device 100 includes one or more printed circuit boards (PCBs) 101, and at least one of PCBs 101 includes one or more electronic chip(s) or integrated circuit(s) 102. In some implementations, integrated circuit(s) 102 includes one or more of the Schmitt trigger circuits described in more detail below.

Examples of integrated circuit(s) 102 may include, for instance, a System-On-Chip (SoC), an Application Specific Integrated Circuit (ASIC), a Digital Signal Processor (DSP), a Field-Programmable Gate Array (FPGA), a processor, a microprocessor, a controller, a microcontroller (MCU), or the like. Additionally or alternatively, integrated circuit(s) 102 may include a memory circuit or device such as, for example, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate (e.g., DDR, DDR2, DDR3, etc.) RAM, an Erasable Programmable ROM (EPROM), an Electrically Erasable Programmable ROM (EEPROM), etc.

Additionally or alternatively, integrated circuit(s) 102 may include one or more mixed-signal or analog circuits, such as, for example, Analog-to-Digital Converter (ADCs), Digital-to-Analog Converter (DACs), Phased Locked Loop (PLLs), oscillators, filters, amplifiers, transformers, etc. Additionally or alternatively, integrated circuit(s) 102 may include one or more Micro-ElectroMechanical Systems (MEMS), Nano-ElectroMechanical Systems (NEMS), or the like. As such, integrated circuit(s) 102 may include a number of different portions, areas, or regions. These various portions may include one or more processing cores, cache memories, internal bus(es), timing units, controllers, analog sections, mechanical elements, etc.

Generally speaking, integrated circuit(s) 102 may be disposed within an electronic component package configured to be mounted onto PCB 101 using any suitable packaging technology such as, for example, Ball Grid Array (BGA) packaging or the like. In some applications, PCB 101 may be mechanically mounted within or fastened onto electronic device 100. It should be noted that, in certain implementations, PCB 101 may take a variety of forms and/or may include a plurality of other elements or components in addition to integrated circuit(s) 102.

As previously noted, integrated circuit(s) 102 may include a wide variety of analog and/or digital circuitry. An example of such circuitry is the "Schmitt trigger."

Figure 2:
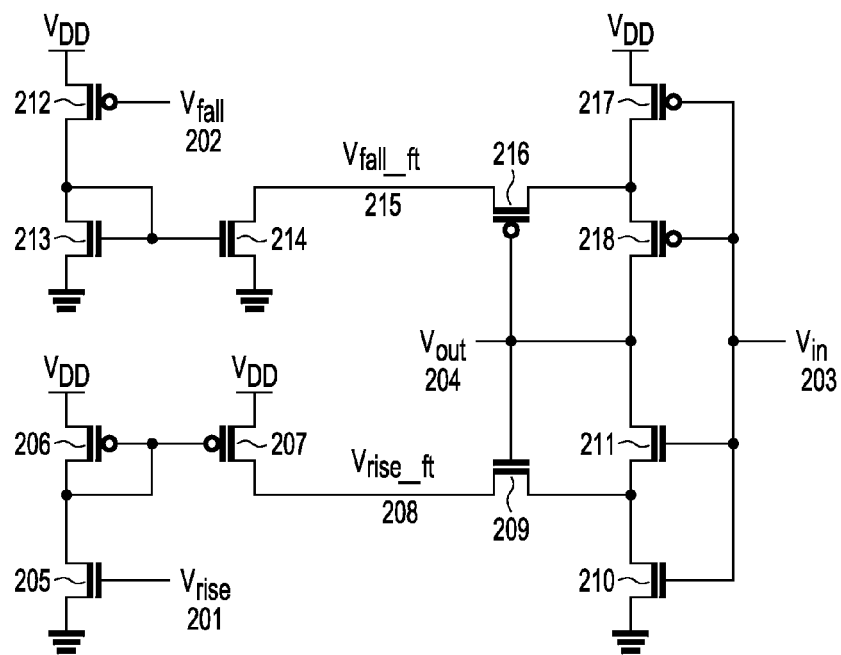
FIG. 2 is a circuit diagram of an example of a Schmitt trigger circuit with quasi rail-to-rail hysteresis according to some embodiments.

FIG. 2 is a circuit diagram of an example of Schmitt trigger circuit 200 (or simply "Schmitt trigger") with near rail-to-rail hysteresis. In some embodiments, Schmitt trigger 200 may be implemented within integrated circuit(s) 102 of FIG. 1. As illustrated, $V_{rise}$ 201 is a high threshold voltage value, $V_{fall}$ 202 is a low threshold voltage value, $V_{in}$ 203 is a time-varying input signal, and $V_{out}$ 204 is the output of circuit 200. In this example, the bottom half of circuit 200 (i.e., below $V_{out}$ 204) is referred to as "rising trip" portion of circuit 200, whereas the top half of circuit 200 (i.e., above $V_{out}$ 204) is referred to as "falling trip" portion of circuit 200.

In the rising trip portion, NMOS transistor 205 is configured to receive $V_{rise}$ 201, a high threshold voltage value, at its gate. The source of NMOS transistor 205 is operably coupled to ground, and the drain of NMOS transistor 205 is operably coupled to the drain of PMOS transistor 206. The source of PMOS transistor 206 is operably coupled to supply voltage $V_{dd}$. The drain of PMOS transistor 206 is also operably coupled to the gates of PMOS transistor 206 and of PMOS transistor 207. The source of PMOS transistor 207 is operably coupled to supply voltage $V_{dd}$, and the drain of PMOS transistor 207 is operably coupled to the drain of NMOS transistor 209. The gate of NMOS transistor 209 is operably coupled to $V_{out}$ 204, and the source of NMOS transistor 209 is operably coupled to the drain of NMOS transistor 210. The gate of NMOS transistor 210 is operably coupled to $V_{in}$ 203, and the source of NMOS transistor 210 is operably coupled to ground. NMOS transistor 211 has its gate operably coupled to $V_{in}$ 203, its drain operably coupled to $V_{out}$ 204, and its source operably coupled to the drain of NMOS transistor 210.

In the falling trip portion, PMOS transistor 212 is configured to receive $V_{fall}$ 202, a low threshold voltage value, at its gate. The source of PMOS transistor 212 is operably coupled to supply voltage $V_{dd}$, and the drain of PMOS transistor 212 is operably coupled to the drain of NMOS transistor 213. The source of NMOS transistor 213 is operably coupled to ground. The drain of NMOS transistor 213 is also operably coupled to the gates of NMOS transistor 213 and of NMOS transistor 214. The source of NMOS transistor 214 is operably coupled to ground, and the drain of NMOS transistor 214 is operably coupled to the drain of PMOS transistor 216. The gate of PMOS transistor 216 is operably coupled to $V_{out}$ 204, and the source of PMOS transistor 216 is operably coupled to the drain of PMOS transistor 217. The gate of PMOS transistor 217 is operably coupled to $V_{in}$ 203, and the source of PMOS transistor 210 is operably coupled to $V_{dd}$. PMOS transistor 218 has its gate operably coupled to $V_{in}$ 203, its drain operably coupled to $V_{out}$ 204, and its source operably coupled to the drain of PMOS transistor 217.

With respect to the rising trip portion of circuitry 200, it should be noted that a comparison is made between $V_{rise}$ 201 and $V_{in}$ 203 by NMOS transistors 205 and 210. PMOS transistors 206 and 207 operate as a 1:1 current mirror ("PMOS-based current mirror"), and NMOS transistor 209 operates and as a switch that activates or deactivates the rising trip portion. Conversely, in the falling trip portion of circuitry 200, a comparison is made between $V_{fall}$ 202 and $V_{in}$ 203 by PMOS transistors 212 and 217. NMOS transistors 213 and 214 operate as a 1:1 current mirror ("NMOS-based current mirror"), and PMOS transistor 216 operates as a switch that activates or deactivates the falling trip portion.

In some implementations, $V_{rise}$ 201 and $V_{fall}$ 202 may each have an absolute value within approximately 10% (or less) of the supply rail; thus providing rail-to-rail or near rail-to-rail hysteresis. For example, $V_{dd}$ may be equal to 3.0 V, $V_{rise}$ 201 may be equal to 2.8, and $V_{fall}$ 202 may be equal to 0.2 V. It should be noted, however, that the exact values used for these signals may vary depending upon the particular application, design, technology, or implementation.

Operation of Schmitt trigger 200 may be conveniently explained by examining the rising and falling trip circuitry separately. Particularly, operation of the rising trip circuitry is explained as follows. In its initial condition, $V_{out}$ 204 is at a first logical state, for instance, with a voltage level equal to $V_{dd}$. As previously noted, $V_{out}$ 204 remains at this first logical state until $V_{in}$ 203 becomes greater than a high threshold value (e.g., $V_{rise}$ 201). In this initial state, PMOS transistor 216 is turned off and falling trip circuitry is essentially decoupled from the rest of circuit 200 for purposes of this analysis. Moreover, when $V_{in}$ 203 is close to $V_{dd}$ (i.e., close to the supply rail), PMOS devices 217 and 218 are operating in weak-inversion mode, so in a first order analysis threshold disturbances may be left aside.

NMOS transistor 205 receives $V_{rise}$ 201 and NMOS transistor 210 receives $V_{in}$ 203. The current through NMOS transistor 205 is mirrored by the PMOS-based current mirror including PMOS transistors 206 and 207. The gate of NMOS transistor 209 also receives $V_{out}$ 204=$V_{dd}$, and thus it is closed (i.e., forming a short circuit). As such, transitions are made by current comparison.

Specifically, $V_{rise\_ft}$ 208 is applied to the drain of NMOS transistor 210. When $V_{in}$ 203 is smaller than $V_{rise}$ 201, $V_{rise\_ft}$ 208 is at $V_{dd}$. Also, when $V_{in}$ 203 is equal to $V_{rise}$ 201, $V_{rise\_ft}$ 208 is equal to $V_{dd}/2$. Also, both current sources generated from NMOS transistor 205 and 210 have the same gate-to-source voltage ($V_{gs}$). Then, when $V_{in}$ 203 greater than $V_{rise}$ 201, $V_{rise\_ft}$ 208 goes to ground (e.g., 0 V). In other words, when $V_{in}$ 203 is greater than $V_{rise}$ 201, both NMOS transistors 210 and 211 are closed, therefore causing $V_{out}$ 204 to also go to ground (e.g., 0 V). Here it should be noted that NMOS transistor 211 turns on quickly due to its increasing gate-to-source voltage (211's $V_{gs}=V_{in}$ 201–$V_{rise\_ft}$ 208).

Figure 3:
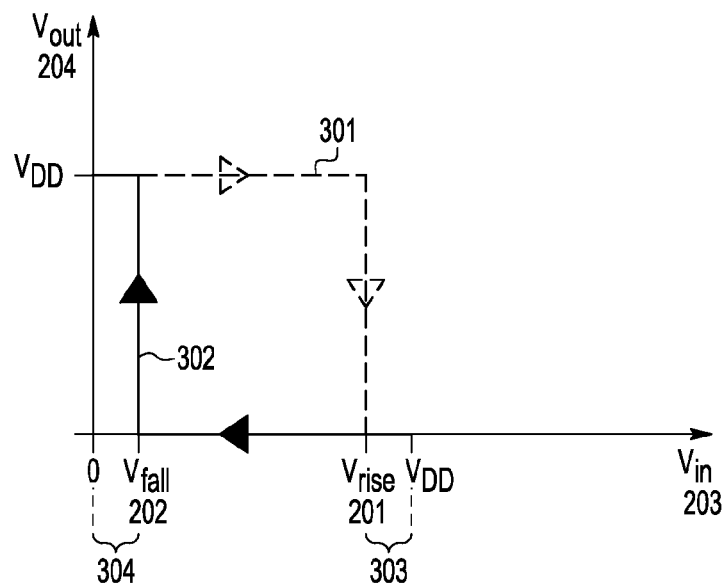
FIG. 3 is a graph illustrating a hysteresis loop of a Schmitt trigger circuit with quasi rail-to-rail hysteresis according to some embodiments.
Figure 4:
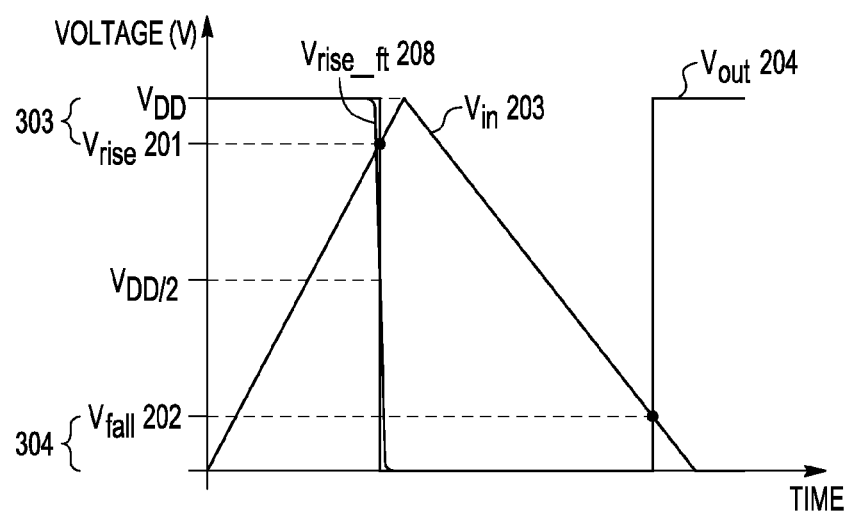
FIG. 4 is a graph illustrating operation of a Schmitt trigger circuit with quasi rail-to-rail hysteresis over time according to some embodiments.

To facilitate explanation, FIG. 3 shows graph 300 of a hysteresis loop of Schmitt trigger circuitry 200 according to some embodiments. In graph 300, curve 301 shows the behavior of $V_{out}$ 204 as $V_{in}$ 203 increases in value. That is, $V_{out}$ 204 stays at $V_{dd}$ until $V_{in}$ 203 rises up to $V_{rise}$ 201, after which $V_{out}$ 204 goes to 0 V. Meanwhile, FIG. 4 shows a graph of the output voltage in comparison with the input voltage (hysteresis loop) of Schmitt trigger circuitry 200, according to some embodiments. With respect to graph 400, it may be noted that, as $V_{in}$ 203 increases from 0 V, $V_{out}$ 204 remains at $V_{dd}$ until $V_{in}$ 203 overcomes $V_{rise}$ 201, after which $V_{out}$ 204 drops to 0 V despite $V_{in}$ 203 continuing to increase between $V_{rise}$ 201 and $V_{dd}$. In some embodiments, the difference $\Delta V$ 303 between $V_{dd}$ and $V_{rise}$ 201 may be within 10% of the value of $V_{dd}$.

Referring back to FIG. 2, once $V_{out}$ 204 assumes the second logical state (e.g., $V_{out}$ 204 equals ground or 0 V), $V_{out}$ 204 may remain in that condition until $V_{in}$ 203 drops below a low threshold value (e.g., $V_{fall}$ 202). In this situation, NMOS transistor 209 is turned off and the rising trip circuitry is essentially decoupled from the rest of circuit 200 for purposes of this analysis. Moreover, when $V_{in}$ 203 is close to 0 V (i.e., close to the ground rail), NMOS devices 210 and 211 are operating in weak-inversion mode, so in a first order analysis, threshold disturbances are not substantial.

PMOS transistor 212 receives $V_{fall}$ 202 and PMOS transistor 217 receives $V_{in}$ 203. The current through PMOS transistor 212 is mirrored by the NMOS-based current mirror including NMOS transistors 213 and 214. The gate of PMOS transistor 216 also receives $V_{out}$ 204=0 V, and thus it is closed (i.e., forming a short circuit). Similarly as above, here the transitions are also made by current comparison. As such, $V_{fall\_ft}$ 215 is applied to the drain of PMOS transistor 217. Also, when $V_{in}$ 203 is greater than $V_{fall}$ 202, $V_{fall\_ft}$ 215 is at 0 V. When $V_{in}$ 203 is equal to $V_{rise}$ 201, $V_{fall\_ft}$ 215 is ideally equal to $V_{dd}/2$. Then, when $V_{in}$ 203 is smaller than $V_{fall}$ 202, $V_{fall\_ft}$ 215 goes to $V_{dd}$. In other words, when $V_{in}$ 203 is smaller than $V_{fall}$ 202, both PMOS transistors 217 and 218 are closed, therefore causing $V_{out}$ 204 to reach the supply rail. Here it should be noted that PMOS transistor 218 turns on quickly due to an increasing gate-to-source voltage (218's $V_{gs}=V_{fall}$ 202−$(V_{dd}/2) \approx V_{dd}/2$).

Referring to FIG. 3, graph 300, curve 302 shows the behavior of $V_{out}$ 204 as $V_{in}$ 203 decreases in value. That is, $V_{out}$ 204 stays at 0 V until $V_{in}$ 203 becomes smaller than $V_{fall}$ 202, after which $V_{out}$ 204 goes to $V_{dd}$. In FIG. 4 it may be noted that, as $V_{in}$ 203 decreases from $V_{dd}$, $V_{out}$ 204 remains at 0 V until $V_{in}$ 203 reaches $V_{fall}$ 202, after which $V_{out}$ 204 rises to $V_{dd}$ despite $V_{in}$ 203 continuing to decrease between $V_{fall}$ 202 and 0 V. In some embodiments, the difference $\Delta V$ 304 between $V_{fall}$ 202 and 0 V may be within 10% of the value of $V_{dd}$, thus providing hysteresis characteristics that are the difference between $V_{rise}$ 201 and $V_{fall}$ 202.

Although in the example described above the first and second logical states are shown as $V_{dd}$ and 0 V (or ground), respectively, it should be noted that other configurations are possible. For example, in a non-inverting configuration, when $V_{in}$ 203 is higher than the $V_{rise}$ 201, $V_{out}$ 204 is at a logic high (e.g., "$V_{dd}$"), and, when $V_{in}$ 203 is lower that $V_{fall}$ 202, $V_{out}$ 204 is at a logic low (e.g., "0" or ground). In an inverting configuration, when $V_{in}$ 203 is higher than $V_{rise}$ 201, $V_{out}$ 204 is at a logic low, and, when $V_{in}$ 203 is below $V_{fall}$ 202, $V_{out}$ 204 is at a logic high.

It should be noted that Schmitt trigger circuitry 200 is shown by way of illustration, and that certain variations are contemplated. For example, in some embodiments, an additional NMOS switch (not shown) may be operably coupled between MOS transistor 205 and PMOS transistor 206 to shut off the electric current flowing through NMOS transistor 205 upon $V_{out}$ 204's transition, for example, using an enabling signal. Additionally or alternatively, an additional PMOS switch (not shown) may be operably coupled between PMOS transistor 212 and NMOS transistor 213 to shut off the electric current flowing through PMOS transistor 212 upon $V_{out}$ 204's transition, for example, using the inverse or complement of the same enabling signal. As such, current mirrors 206-207 and 213-214 are disabled when not in use, thus resulting in additional power savings.

Referring now to FIG. 5, a flowchart of an example of method 500 of operating Schmitt trigger circuitry 200 is provided according to some embodiments. As illustrated, at block 501, method 500 may include receiving a threshold voltage value at a first transistor of a first doping type. For example, in the case of rising trip circuitry, the threshold voltage is $V_{rise}$ 201 and the first transistor of the first type is NMOS transistor 205. Conversely, in the case of falling trip circuitry, the threshold voltage is $V_{fall}$ 202 and the first transistor of the first type is PMOS transistor 212.

At block 502, method 500 may include receiving an input signal at a second transistor of the first doping type, the first and second transistors coupled to each other through a current mirror of a second doping type. For example, in the case of rising trip circuitry, the input signal is $V_{in}$ 203, the second transistor of the first doping type is NMOS transistor 210, and the first and second transistors within the current mirror is PMOS transistors 206 and 207. Conversely, in the case of falling trip circuitry, the input signal is still be $V_{in}$ 203, but the second transistor of the first doping type is PMOS transistor 217, and the first and second transistors within the current mirror is NMOS transistors 213 and 214.

Here it should be noted that the act of receiving the threshold voltage value at a first transistor of a first doping type at block 501 and then receiving an input signal at a second transistor of the same doping type as the first transistor at block 502 may allow the Schmitt trigger to operate with rail-to-rail or near rail-to-rail hysteresis.

At block 503, method 500 may include switching the output of Schmitt trigger circuitry 200 (e.g., $V_{out}$ 204) from a first logic state to a second logic state in response to the input signal meeting or overcoming the threshold. For example, in the case of rising trip circuitry, $V_{out}$ 04 may switch from a supply rail (e.g., $V_{dd}$) to the ground rail (e.g., 0 V) in response to $V_{in}$ 203 rising above $V_{rise}$ 201. Conversely, in the case of falling trip circuitry, $V_{out}$ 204 may switch from the ground rail (e.g., 0 V) to the supply rail (e.g., $V_{dd}$) in response to $V_{in}$ 203 dropping below $V_{fall}$ 202.

It should be understood that the various operations described herein, particularly in connection with FIG. 5, may be implemented in hardware or other circuitry. The order in which each operation of a given method is performed may be changed, and various elements of the systems illustrated herein may be added, reordered, combined, omitted, modified, etc. It is intended that the invention(s) described herein embrace all such modifications and changes and, accordingly, the above description should be regarded in an illustrative rather than a restrictive sense.

In some embodiments, the systems and methods described herein may provide Schmitt triggers with rail-to-rail or near rail-to-rail hysteresis. Unlike conventional circuits, the Schmitt triggers disclosed herein are highly insensitive to PVT variations, and may provide very accurate hysteresis when threshold values are close to the supply and/or ground rails (e.g., within 10% or less of the rails). As such, these Schmitt triggers also provide a very high noise rejection ratio in quasi rail-to-rail conditions. For example, in an oscillator implementation, jitter effect and uncontrollable frequency are reduced or minimized by using the Schmitt triggers discussed above. Also, other applications of Schmitt trigger circuits may include providing a very accurate hysteresis as a control variable. For example, the circuit's hysteresis may be used to define voltage intervals to integrate in a relaxation oscillator. Additionally or alternatively, a Schmitt trigger circuit as discussed above may work as a filter when designed such that its hysteresis increases the rejection (amplitude) of a noise disturbance.

In an illustrative, non-limiting embodiment, a Schmitt trigger may include rising trip circuitry configured to switch an output node from a first logic state to a second logic state in response to an input voltage being greater than a high threshold voltage, the rising trip circuitry including a first NMOS transistor configured to receive the high threshold voltage and a second NMOS transistor configured to receive the input voltage, the first NMOS transistor operably coupled to the second NMOS transistor through a PMOS current mirror. The Schmitt trigger may also include falling trip circuitry operably coupled to the rising trip circuitry and configured to switch the output node from the second logic state to a first logic state in response to the input voltage being smaller than a low threshold voltage, the falling trip circuitry including a first PMOS transistor configured to receive the low threshold voltage and a second PMOS transistor configured to receive the input voltage, the first PMOS transistor operably coupled to the second PMOS transistor through an NMOS current mirror.

In some implementations, the first logic state is a logic "1", and the second logic state is a logic "0". In other implementations, however, the first logic state is a logic "0", and the second logic state is a logic "1".

Moreover, the PMOS current mirror may be a 1:1 current mirror having two or more PMOS transistors. A gate of the first NMOS transistor may be configured to receive the high threshold voltage, and a drain of the first NMOS transistor may be operably coupled to the PMOS current mirror. An output of the PMOS current mirror may be operably coupled to a drain of the second NMOS transistor through a first switch, a gate of the first switch may be operably coupled to the output node, and a gate of the second NMOS transistor may be configured to receive the input voltage. The first switch may be another NMOS transistor having its gate operably coupled to the output node. Also, a third NMOS transistor may have a drain operably coupled to the output node, a source operably coupled to the drain of the second NMOS transistor, and a gate operably coupled to the input voltage.

Additionally or alternatively, the NMOS current mirror may be a 1:1 current mirror having two or more NMOS transistors. A gate of the first PMOS transistor may be configured to receive the low threshold voltage, and a source of the first PMOS transistor may be operably coupled to the NMOS current mirror. An output of the NMOS current mirror may be operably coupled to a source of the second PMOS transistor through a second switch, a gate of the second switch may be operably coupled to the output node, and a gate of the second PMOS transistor may be configured to receive the input voltage. The second switch may be another PMOS transistor having its gate operably coupled to the output node. A third PMOS transistor may have a source operably coupled to the output node, a drain operably coupled to the source of the second PMOS transistor, and a gate operably coupled to the input voltage.

In another illustrative, non-limiting embodiment, a method may include switching an output node of a Schmitt trigger from a first logic state to a second logic state in response to an input voltage meeting a threshold voltage, where the threshold voltage is applied to a first transistor of a first doping type and the input voltage is applied to a second transistor of the first doping type, the first and second transistors operably coupled to each other through a current mirror of a second doping type.

In some implementations, the first doping type may be an n-type and wherein the second doping type may be a p-type. The threshold voltage may be a rising threshold voltage, and the rising threshold voltage may have a value within 10% of a value of a supply voltage provided to the first transistor. Additionally or alternatively, the first doping type may be a p-type and wherein the second doping type may be an n-type. The threshold voltage may be a falling threshold voltage, and the falling threshold voltage may have a value within 10% of a value of a ground voltage.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A Schmitt trigger, comprising:
rising trip circuitry configured to switch an output node from a first logic state to a second logic state in response to an input voltage being greater than a high threshold voltage, the rising trip circuitry including a first NMOS transistor configured to receive the high threshold voltage and a second NMOS transistor configured to receive the input voltage, the first NMOS transistor operably coupled to the second NMOS transistor through a PMOS current mirror; and
falling trip circuitry operably coupled to the rising trip circuitry and configured to switch the output node from the second logic state to a first logic state in response to the input voltage being smaller than a low threshold voltage, the falling trip circuitry including a first PMOS transistor configured to receive the low threshold voltage and a second PMOS transistor configured to receive the input voltage, the first PMOS transistor operably coupled to the second PMOS transistor through an NMOS current mirror.

2. The Schmitt trigger of claim 1, wherein the first logic state is a logic "1", and wherein the second logic state is a logic "0".

3. The Schmitt trigger of claim 1, wherein the first logic state is a logic "0", and wherein the second logic state is a logic "1".

4. The Schmitt trigger of claim 1, wherein the PMOS current mirror is a 1:1 current mirror having two or more PMOS transistors.

5. The Schmitt trigger of claim 1, wherein a gate of the first NMOS transistor is configured to receive the high threshold voltage, and wherein a drain of the first NMOS transistor is operably coupled to the PMOS current mirror.

6. The Schmitt trigger of claim 5, wherein an output of the PMOS current mirror is operably coupled to a drain of the second NMOS transistor through a first switch, wherein a gate of the first switch is operably coupled to the output node, and wherein a gate of the second NMOS transistor is configured to receive the input voltage.

7. The Schmitt trigger of claim 6, wherein the first switch is another NMOS transistor having its gate operably coupled to the output node.

8. The Schmitt trigger of claim 6, further comprising a third NMOS transistor having a drain operably coupled to the output node, its source operably coupled to the drain of the second NMOS transistor, and its gate operably coupled to the input voltage.

9. The Schmitt trigger of claim 1, wherein the NMOS current mirror is a 1:1 current mirror having two or more NMOS transistors.

10. The Schmitt trigger of claim 1, wherein a gate of the first PMOS transistor is configured to receive the low threshold voltage, and wherein a source of the first PMOS transistor is operably coupled to the NMOS current mirror.

11. The Schmitt trigger of claim 10, wherein an output of the NMOS current mirror is operably coupled to a source of the second PMOS transistor through a second switch, wherein a gate of the second switch is operably coupled to the output node, and wherein a gate of the second PMOS transistor is configured to receive the input voltage.

12. The Schmitt trigger of claim 11, wherein the second switch is another PMOS transistor having its gate operably coupled to the output node.

13. The Schmitt trigger of claim 11, further comprising a third PMOS transistor having a source operably coupled to the output node, its drain operably coupled to the source of the second PMOS transistor, and its gate operably coupled to the input voltage.

14. A method, comprising:
switching an output node of a Schmitt trigger from a first logic state to a second logic state in response to an input voltage meeting a threshold voltage, wherein the threshold voltage is applied to a first transistor of a first doping type and the input voltage is applied to a second transistor of the first doping type, the first and second transistors operably coupled to each other through a current mirror of a second doping type.

15. The method of claim 14, wherein the first doping type is an n-type and wherein the second doping type is a p-type.

16. The method of claim 15, wherein the threshold voltage is a rising threshold voltage.

17. The method of claim 16, wherein the rising threshold voltage has a value within 10% of a value of a supply voltage provided to the first transistor.

18. The method of claim 14, wherein the first doping type is a p-type and wherein the second doping type is an n-type.

19. The method of claim 18, wherein the threshold voltage is a falling threshold voltage.

20. The method of claim 19, wherein the falling threshold voltage has a value within 10% of a value of a ground voltage.

* * * * *